(12) United States Patent
Kao et al.

(10) Patent No.: US 11,710,782 B2
(45) Date of Patent: *Jul. 25, 2023

(54) POST-FORMATION MENDS OF DIELECTRIC FEATURES

(71) Applicant: Taiwan Semiconductor Manufacturing Co., Ltd., Hsinchu (TW)

(72) Inventors: Wan-Yi Kao, Hsinchu County (TW); Hung Cheng Lin, Hsinchu (TW); Che-Hao Chang, Hsinchu (TW); Yung-Cheng Lu, Hsinchu (TW); Chi On Chui, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/728,296

(22) Filed: Apr. 25, 2022

(65) Prior Publication Data

US 2022/0254901 A1 Aug. 11, 2022

Related U.S. Application Data

(63) Continuation of application No. 16/952,550, filed on Nov. 19, 2020, now Pat. No. 11,316,034.

(Continued)

(51) Int. Cl.
*H01L 29/66* (2006.01)
*H01L 29/06* (2006.01)
(Continued)

(52) U.S. Cl.
CPC ...... *H01L 29/6681* (2013.01); *H01L 29/0653* (2013.01); *H01L 29/0847* (2013.01); *H01L 29/7851* (2013.01)

(58) Field of Classification Search
CPC ..... H01L 21/823431; H01L 21/823481; H01L 21/823821; H01L 21/823878; H01L 21/845; H01L 27/0886; H01L 27/0924; H01L 27/10879; H01L 27/1211; H01L 29/0653; H01L 29/0847; H01L 29/41791; H01L 29/66795; H01L 29/66814;
(Continued)

(56) References Cited

U.S. PATENT DOCUMENTS 11,316,034 B2 * 4/2022 Kao .................. H01L 29/0653
2019/0067417 A1 * 2/2019 Ching ............ H01L 21/823431
(Continued)

FOREIGN PATENT DOCUMENTS

CN 110838520 A 2/2020
TW 202013510 A 4/2020

*Primary Examiner* — David C Spalla
(74) *Attorney, Agent, or Firm* — Haynes and Boone, LLP

(57) ABSTRACT

The present disclosure provides embodiments of semiconductor structures and method of forming the same. An example semiconductor structure includes a first source/drain feature and a second source/drain feature and a hybrid fin disposed between the first source/drain feature and the second source/drain feature and extending lengthwise along a first direction. The hybrid fin includes an inner feature and an outer layer disposed around the inner feature. The outer layer includes silicon oxycarbonitride and the inner feature includes silicon carbonitride.

20 Claims, 14 Drawing Sheets

Related U.S. Application Data

(60) Provisional application No. 63/032,431, filed on May 29, 2020.

(51) Int. Cl.
*H01L 29/08* (2006.01)
*H01L 29/78* (2006.01)

(58) Field of Classification Search
CPC .............. H01L 29/785; H01L 29/7851; H01L 29/7853; H01L 29/7855; H01L 2029/7858
See application file for complete search history.

(56) References Cited

U.S. PATENT DOCUMENTS

| | | | |
|---|---|---|---|
| 2019/0067445 A1* | 2/2019 | Ching | H01L 29/7851 |
| 2019/0103304 A1* | 4/2019 | Lin | H01L 29/6681 |
| 2019/0326287 A1* | 10/2019 | Liaw | H01L 29/0653 |
| 2020/0098750 A1 | 3/2020 | Lin et al. | |

* cited by examiner

POST-FORMATION MENDS OF DIELECTRIC FEATURES

PRIORITY DATA

This application is a continuation application of U.S. patent application Ser. No. 16/952,550, filed Nov. 19, 2020, which claims the benefit of U.S. Provisional Application No. 63/032,431, entitled "POST-FORMATION REPAIR OF DIELECTRIC FEATURES," filed May 29, 2020, each of which is herein incorporated by reference in its entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs. Parallel advances in manufacturing have allowed increasingly complex designs to be fabricated with precision and reliability.

For example, hybrid fins may be used to isolate neighboring source/drain features. Because hybrid fins are formed of dielectric materials and do not form active regions, they may also be referred to as dielectric fins or dummy fins. In conventional technology, a seam may be formed along a middle line of a hybrid fin. Such a seam may be widened in subsequent processes and cause dimple profiles in overlying layers or features. Therefore, while existing hybrid fins and methods of forming the same are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
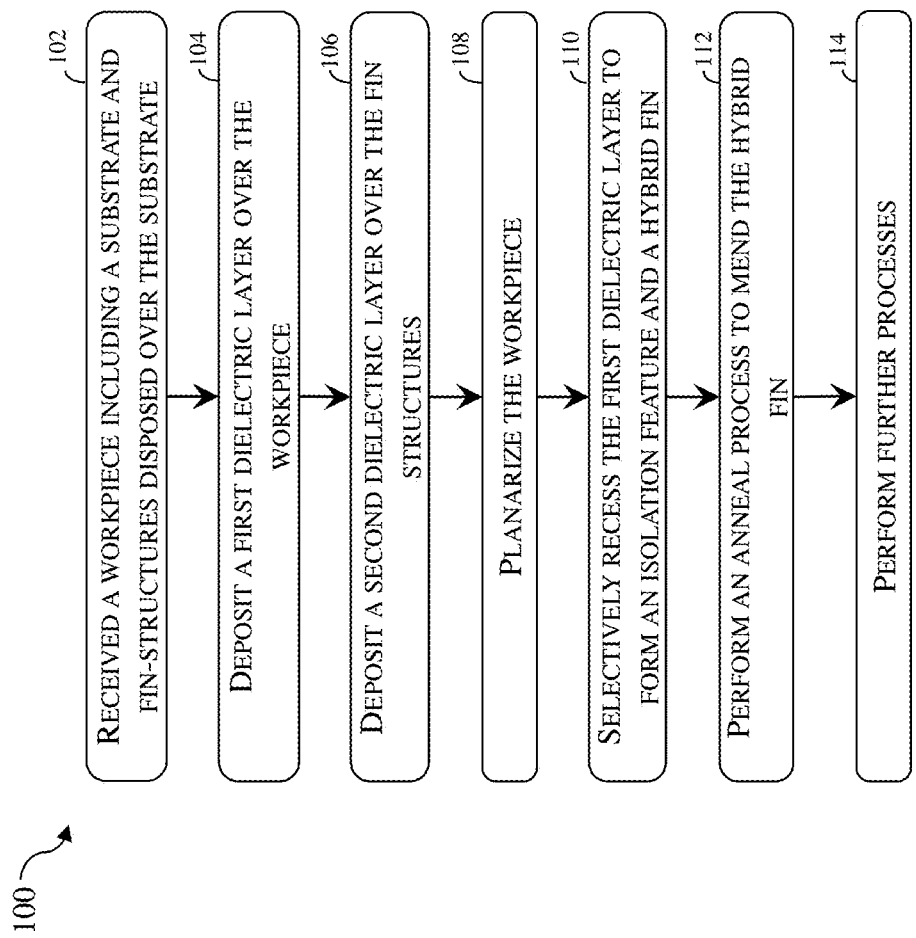
FIG. 1 is a flow diagrams of a method of fabricating a semiconductor device, according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the formation of a feature connected to and/or coupled to another feature in the present disclosure that follows may include embodiments in which the features are formed in direct contact, and may also include embodiments in which additional features may be formed interposing the features, such that the features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

Hybrid fins, also referred to as dielectric fins or dummy fins, are implemented in multi-gate devices to define the space in which source/drain epitaxial features are formed and therefore prevent undesirable merging of neighboring source/drain epitaxial features. Example multi-gate devices include fin-type field effect transistors (FinFETs) or multi-bridge-channel (MBC) transistors. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, or other nanostructures and for that reasons, an MBC transistor may also be referred to as a nanowire transistor or a nanosheet transistor.

To form hybrid fins on a workpiece having fin structures (or fin-shaped structures) on a substrate, a first dielectric layer for an isolation layer is conformally deposited over the fin-shaped structures and the substrate and a second dielectric layer for the hybrid fins is conformally deposited over the first dielectric layer. After the workpiece is planarized to expose the first dielectric layer, the first dielectric layer is selectively recessed to form an isolation feature, such as a shallow trench isolation (STI) feature. After the selective recess, the second dielectric layer that rises above the isolation feature forms hybrid fins. An ideal hybrid fin may be formed when two conformal second dielectric layers seamlessly merge along a middle line of the hybrid fin. However, chances are at least some hybrid fins are less than ideal and a seam may be present along their middle lines. These middle seams are prone to etching and may be widened in subsequent processes. One widened, these middle seams may cause dimple profiles in overlying layers or features. The present disclosure includes methods to form seam-free hybrid fins or to mend the seam in hybrid fins after they are formed.

The various aspects of the present disclosure will now be described in more detail with reference to the figures. FIG. 1 illustrates a flowchart illustrating method 100 for fabricating a semiconductor structure, according to one or more aspects of the present disclosure. Method 100 is merely an example and is not intended to limit the present disclosure to what is explicitly illustrated in method 100. Additional steps can be provided before, during and after the method 100, and some steps described can be replaced, eliminated, or moved around for additional embodiments of the methods. Not all steps are described herein in detail for reasons of simplicity. Method 100 is described below in conjunction with fragmentary cross-sectional views of a workpiece 200 (shown in FIGS. 2-12) at different stages of fabrication according to embodiments of method 100. For avoidance of doubts, throughout the figures, the X direction is perpendicular to the Y direction and the Z direction is perpendicular to both the X direction and the Y direction. It is noted that, because the workpiece 200 may be fabricated into a semiconductor device, the workpiece 200 may be referred to as the semiconductor device 200 as the context requires.

Figure 2:
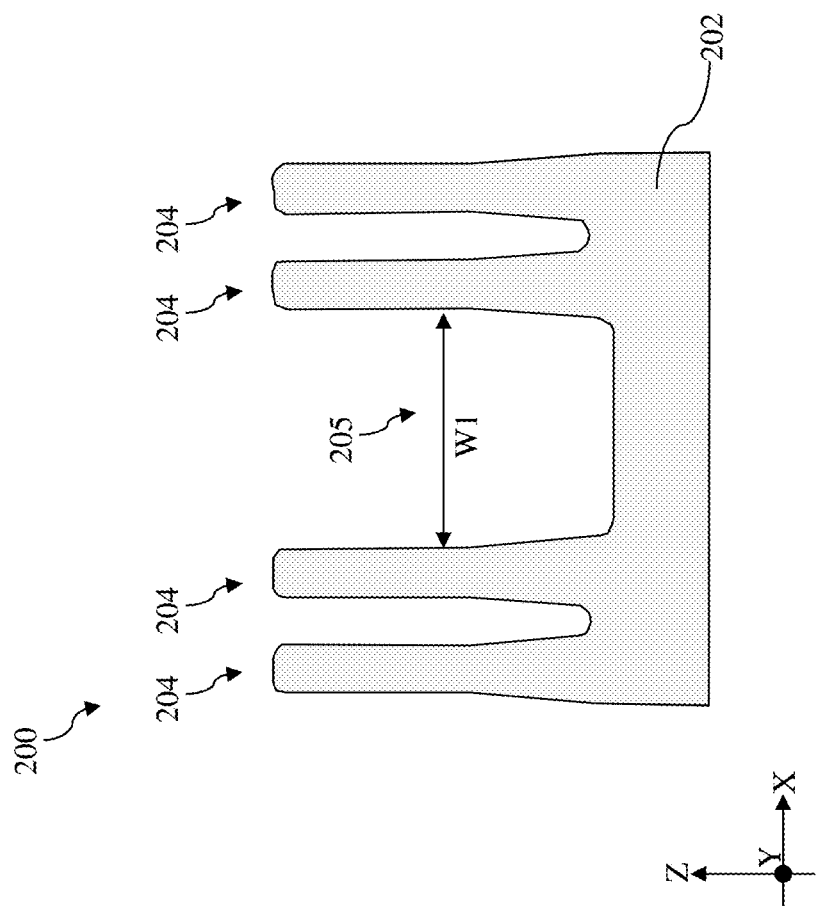
FIGS. 2-12 are fragmentary cross-sectional views of a workpiece at various stages of fabrication of method in FIG. 1, according to various aspects of the present disclosure.

Referring to FIGS. 1 and 2, method 100 includes a block 102 where a workpiece 200 is received. As shown in FIG. 2, the workpiece 200 includes a substrate 202 and fin structures 204 disposed over the substrate 202. In various examples, the substrate 202 includes an elementary (single element) semiconductor, such as silicon (Si) or germanium (Ge) in a crystalline structure; a compound semiconductor, such as silicon carbide (SiC), gallium arsenic (GaAs), gallium phosphide (GaP), indium phosphide (InP), indium arsenide (InAs), and/or indium antimonide (InSb), or an alloy semiconductor such as silicon germanium (SiGe), gallium arsenic phosphide (GaAsP), aluminum indium arsenide (AlInAs), aluminum gallium arsenide (AlGaAs), gallium indium arsenide (GaInAs), gallium indium phosphide (GaInP), and/or gallium indium arsenic phosphide (GaInAsP). The substrate 202 may be uniform in composition or may include various layers, some of which may be patterned to form the fins. The layers may have similar or different compositions, and in various embodiments, some substrate layers have non-uniform compositions to induce device strain and thereby tune device performance. Examples of layered substrates include silicon-on-insulator (SOI) substrates. In some such examples, a layer of the substrate 202 may include an insulator such as a semiconductor oxide, a semiconductor nitride, a semiconductor oxynitride, a semiconductor carbide, and/or other suitable insulator materials. While not explicitly shown in FIG. 2, the substrate 202 may include doped regions, such as wells. In that regard, some portions of the substrate 202 may be doped with p-type dopants, such as boron, $BF_2$, or indium to form p-type wells while other portions of the substrate 202 may be doped with n-type dopants, such as phosphorus or arsenic to form n-type wells.

The fin structures 204 may be formed by etching portions of the substrate 202, by depositing various layers on the substrate 202 and etching the layers, and/or by other suitable techniques. For example, the fin structures 204 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a material layer is formed over the substrate 202 and one or more fin-top hard mask. The material layer is patterned using a photolithography process. Spacers are formed alongside the patterned material layer using a self-aligned process. The sacrificial layer is then removed, and the remaining spacers are used to pattern the one or more fin-top hard mask. The patterned one or more fin-top hard mask is then used to pattern the substrate (and/or various layers deposited on the substrate 202, if formed) into fin structures 204.

In the depicted embodiments, the fin structures 204 are fabricated from the substrate 202 formed of silicon. In these embodiments, the fin structures 204 may form channel regions and source/drain regions of FinFETs. While not shown, the fin structures 204 may also include one or more silicon germanium layers such that they may serve as channel regions and source/drain regions of a p-type fully strained channel (PFSC) transistor. Moreover, while not explicitly shown, the fin structures 204 may be fin-shaped structures formed from an epitaxial layer stack disposed over the substrate 202 and may be formed into a vertical stack of channel members of an MBC transistor. In these embodiments, the epitaxial layer stack includes a plurality of first epitaxial layers interleaved by a plurality of second epitaxial layers. The first epitaxial layers and the second epitaxial layers are of different semiconductor compositions that allow selective removal or recess of the second epitaxial layers. In some examples, the first epitaxial layers are formed of silicon (Si) and the second epitaxial layers are formed of silicon germanium (SiGe). The first epitaxial layers may be referred to as channel layers and the second epitaxial layers may be referred to as sacrificial layers. For simplicity, different aspects of the present disclosure are described below using fin structures for FinFETs as an example. A person of ordinary skill in the art would appreciate that aspects of the present disclosure may be applicable to other multi-gate transistors, such as MBC transistors.

In some embodiments represented in FIG. 2, the fin structures 204 may be grouped in pairs for formation of dual-fin or double-fin devices. Other configurations, such as mono-fin devices, are possible and are fully envisioned by the present disclosure. The two pairs of the fin structures 204 in FIG. 2 are separated by a hybrid fin trench 205. The hybrid fin trench 205 includes a first width W1 along the X direction. The first width W1 is selected such that a hybrid fin may be formed in the hybrid fin trench 205.

Figure 3:
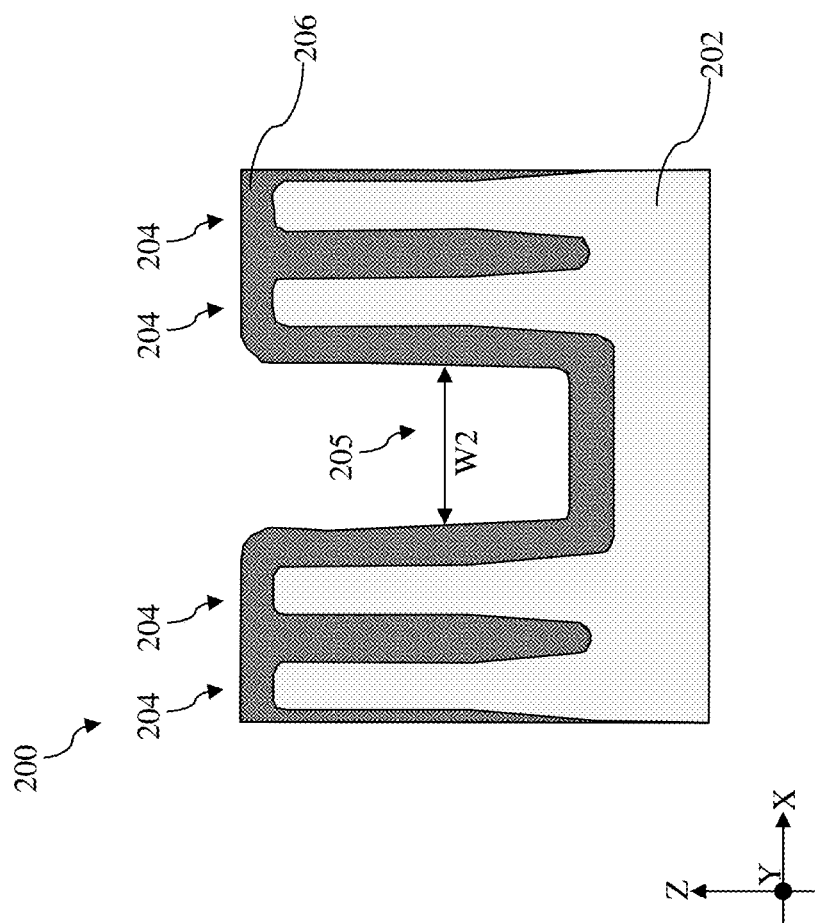

Referring to FIGS. 1 and 3, method 100 includes a block 104 where a first dielectric layer 206 is conformally deposited over the workpiece 200. In some embodiments, the first dielectric layer may include silicon oxide, silicon oxynitride, fluorine-doped silicate glass (FSG), a low-k dielectric, combinations thereof, and/or other suitable materials. To conformally deposit the first dielectric layer 206 over the fin structures 204 and the substrate 202, the first dielectric layer 206 may be deposited by a chemical vapor deposition (CVD) process, a subatmospheric CVD (SACVD) process, a low-pressure CVD (LPCVD) process, a high-density plasma CVD (HDPCVD) process, atomic layer deposition (ALD), and/or other suitable process. As shown in FIG. 3, the conformal deposition of the first dielectric layer 206 completely fills the space between two adjacent fin structures 204 but does not completely fills the hybrid fin trench 205. Instead, the first dielectric layer 206 conformally lines sidewalls and the bottom surface of the hybrid fin trench 205. After the deposition of the first dielectric layer 206, the first width W1 of the hybrid fin trench 205 is reduced to a smaller second width W2, as shown in FIG. 3.

Figure 4:
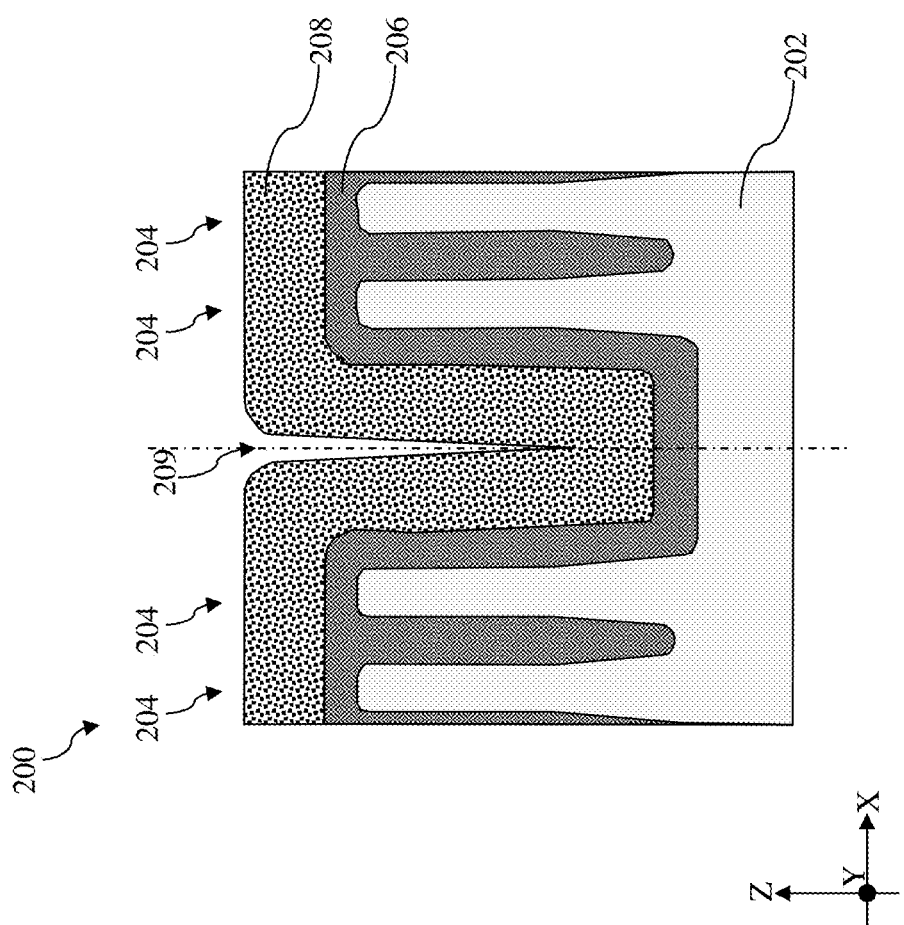
Figure 13:
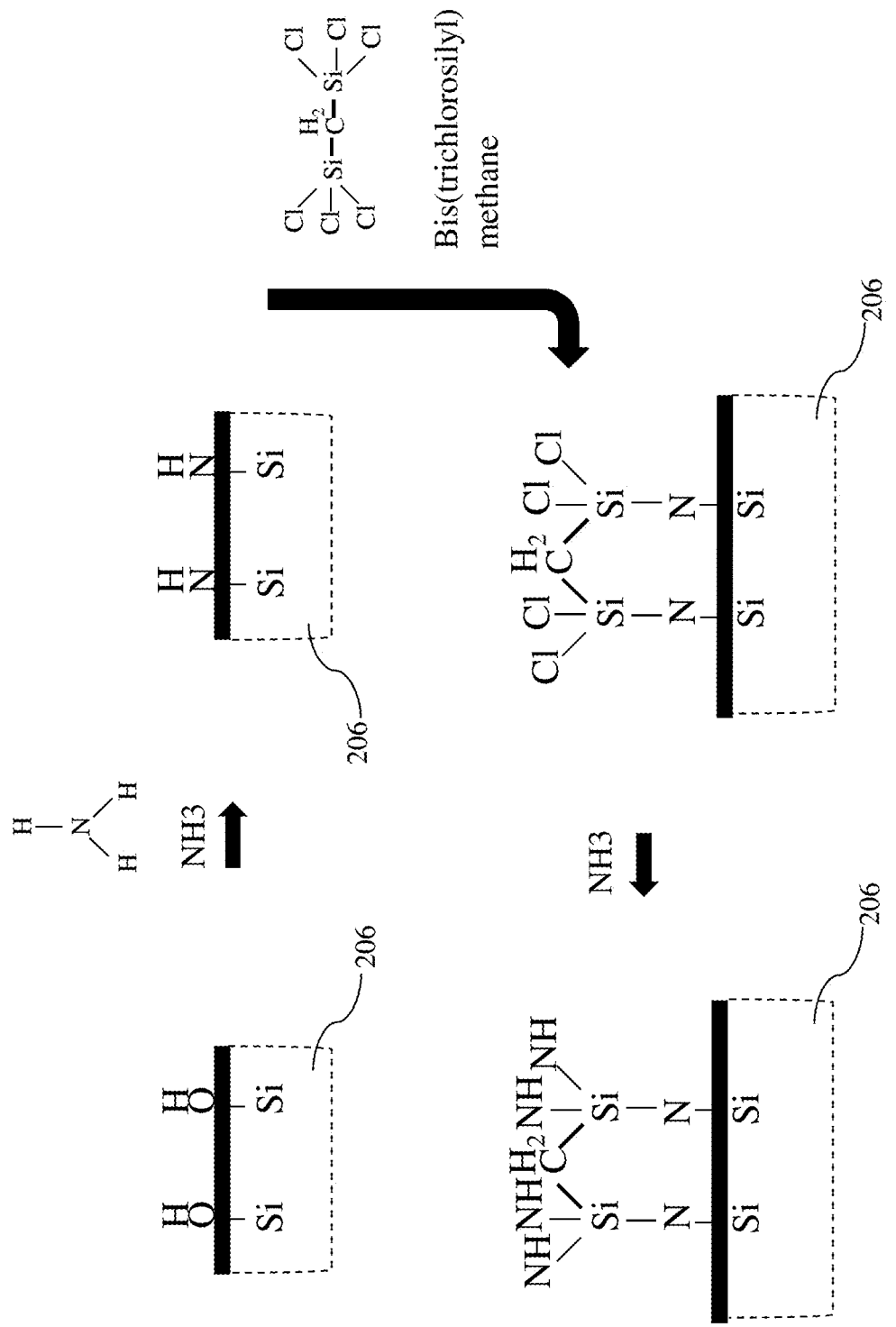
FIG. 13 illustrates schematic diagrams of a deposition cycle for forming a hybrid fin, according to various aspects of the present disclosure.

Referring to FIGS. 1 and 4, method 100 includes a block 106 where a second dielectric layer 208 is conformally deposited over the workpiece 200, including over the first dielectric layer 206. In some embodiments, the second dielectric layer 208 includes hydrogenated silicon carbonitride (H:SiCN) and may be deposited using atomic layer deposition (ALD). FIG. 13 illustrates an ALD cycle according to some implementations of the present disclosure. As shown in FIG. 13, the first dielectric layer 206 deposited at block 104 may include hydroxyl groups (—OH) on its surfaces. In an ALD process chamber, the first dielectric layer 206 is first exposed to an amine-containing precursor, such as ammonia depicted in FIG. 13. The amine-containing precursor is allowed to react with the hydroxyl groups and chemisorbed to the first dielectric layer 206, forming amine groups (—NH) on the surface of the first dielectric layer 206. While not explicitly shown in FIG. 13, the ALD process chamber is then purged with an inert gas, such as nitrogen ($N_2$), argon (Ar) or helium (He) to remove excess amine-containing precursor in the ALD process chamber. After purging, a trichlorosilane derivative, such as bis(trichlorosilyl) methane, is supplied to the ALD process chamber. As illustrated in FIG. 13, the trichlorosilane derivative in the ALD process chamber reacts with and bonds to the amine groups on the surface of the first dielectric layer 206. After the trichlorosilane derivative is allowed to contact the workpiece 200, the ALD process chamber is once again purged with an inert gas to remove excess trichlorosilane derivative that is not chemisorbed on the surface of the first dielectric layer 206. Then, the same amine-containing precursor (ammonia shown in FIG. 13) is once again supplied to the ALD process chamber to replace the chloro functional groups with amine functional groups. At the end of the ALD cycle, the ALD process chamber is purged to remove excess amine-containing precursor. In some implementations, the conformal deposition of the second dielectric layer 208 may be performed at a process temperature between about 500° C. and about 700° C., such as between about 620° C. and about 680° C. In some embodiments, the ALD cycle illustrated in FIG. 13 may be repeated a number of times to substantially fill the hybrid fin trench 205. The number of the ALD cycles is determined by the second width W2 of the hybrid fin trench 205. As shown in FIG. 4, the conformal second dielectric layer 208 may not seamlessly merge along a middle line or center line of the hybrid fin trench 205, resulting in a seam 209. Due to its shape, the seam 209 may also be referred to as a crevice 209. The seam 209 may extend downward along the Z direction and at least a portion of the seam 209 is disposed between the two pairs of the fin structures 204. Because the first dielectric layer 206 is conformally deposited along sidewalls of the hybrid fin trench 205, a portion of the seam 209 is also disposed between two portions of the first dielectric layer 206 that are disposed on sidewalls of fin structures 204.

Figure 5:
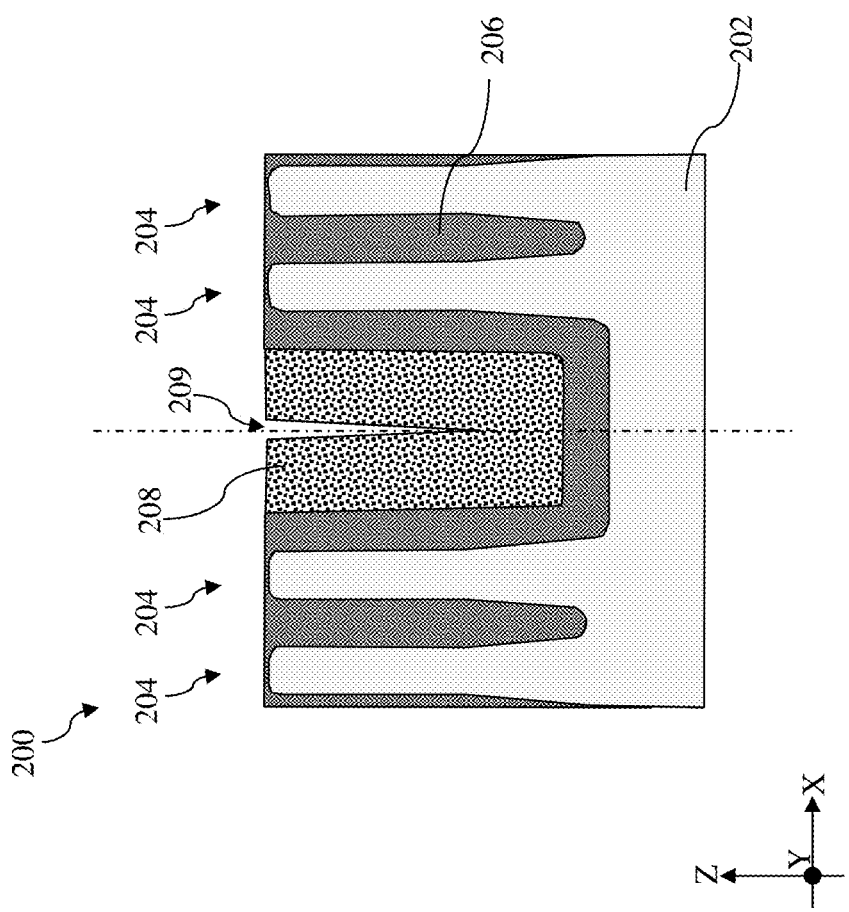

Referring to FIGS. 1 and 5, method 100 includes a block 108 where the workpiece 200 is planarized. A chemical mechanical polishing (CMP) process is performed at block 108 to expose the first dielectric layer 206 over the fin structures 204. Upon conclusion of the operations at block 108, top surfaces of the first dielectric layer 206 and the second dielectric layer 208 are coplanar. As shown in the FIG. 5, although its depth into the second dielectric layer 208 is reduced by the planarization at block 108, the seam 209 remains disposed between the two pairs of fin structures 204.

Figure 6:
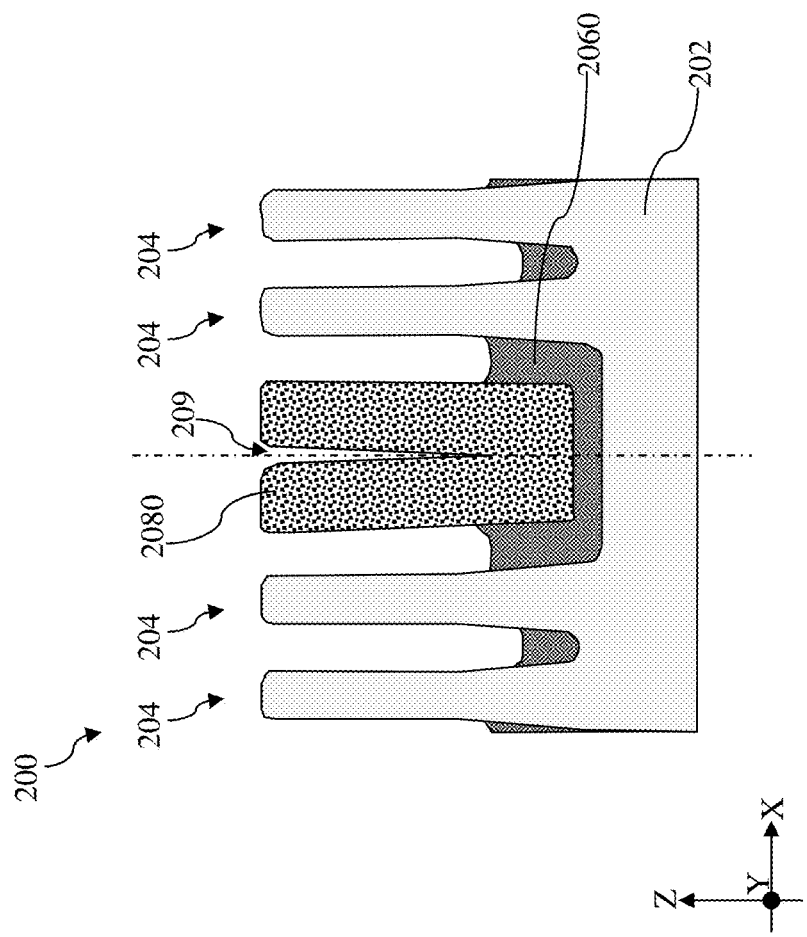

Referring to FIGS. 1 and 6, method 100 includes a block 110 where the first dielectric layer 206 is selectively recessed to form an isolation feature 2060 and a hybrid fin 2080 that rises above the isolation feature 2060. In some embodiments, the first dielectric layer 206 may be selectively recessed using an isotropic wet etch process, such as a diluted hydrofluoric acid (DHF) or a buffered hydrofluoric acid (BHF) etch process. Here, a BHF etch process may include use of hydrofluoric acid (HF), water and ammonium fluoride ($NH_4F$). In some alternative embodiments, the selective recess of the first dielectric layer 206 may be performed using an anisotropic dry etch process, such as one that uses fluorocarbons and oxygen. The anisotropic dry etch process may be facilitated by plasma. As shown in FIG. 6, operations at block 106 selectively recesses the first dielectric layer 206 without substantially etching the fin structures 204 and the second dielectric layer 208. As a result, upon conclusion of the operations at block 106, the fin structures 204 and the second dielectric layer 208 rise above the recessed first dielectric layer 206. For ease of references, the recessed first dielectric layer 206 is referred to as an isolation feature 2060 and the second dielectric layer 208 that rises above the isolation feature 2060 may be referred to as a hybrid fin 2080. As shown in FIG. 6, the seam 209 extends along a middle line of the hybrid fin 2080.

Figure 7:
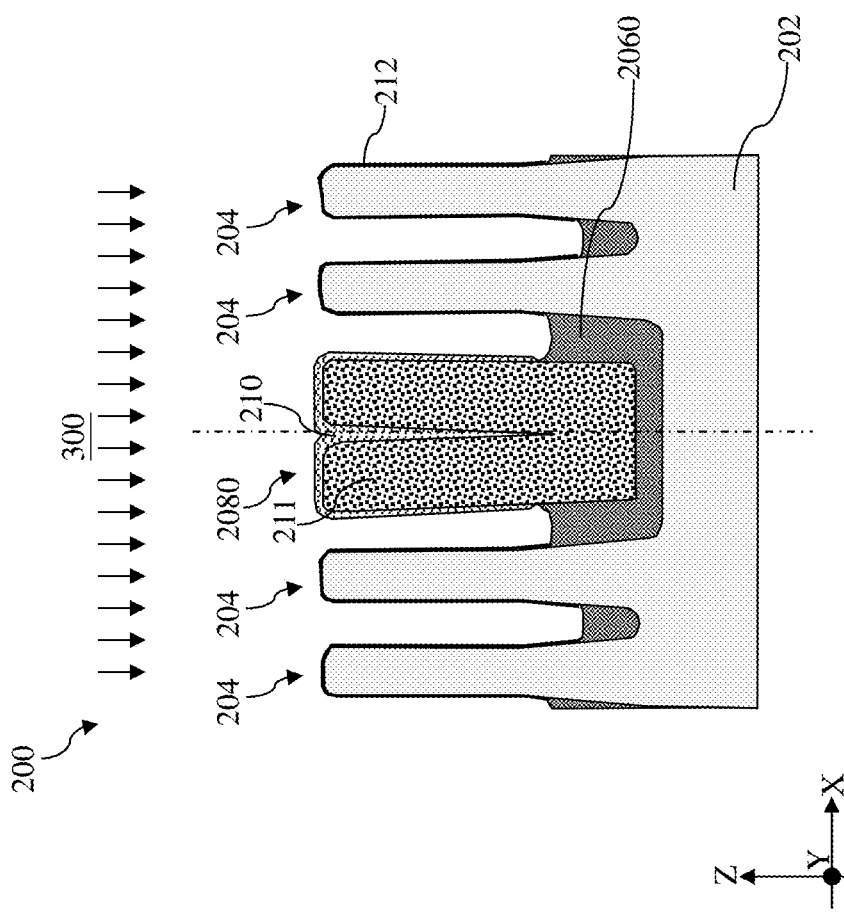
Figure 14:
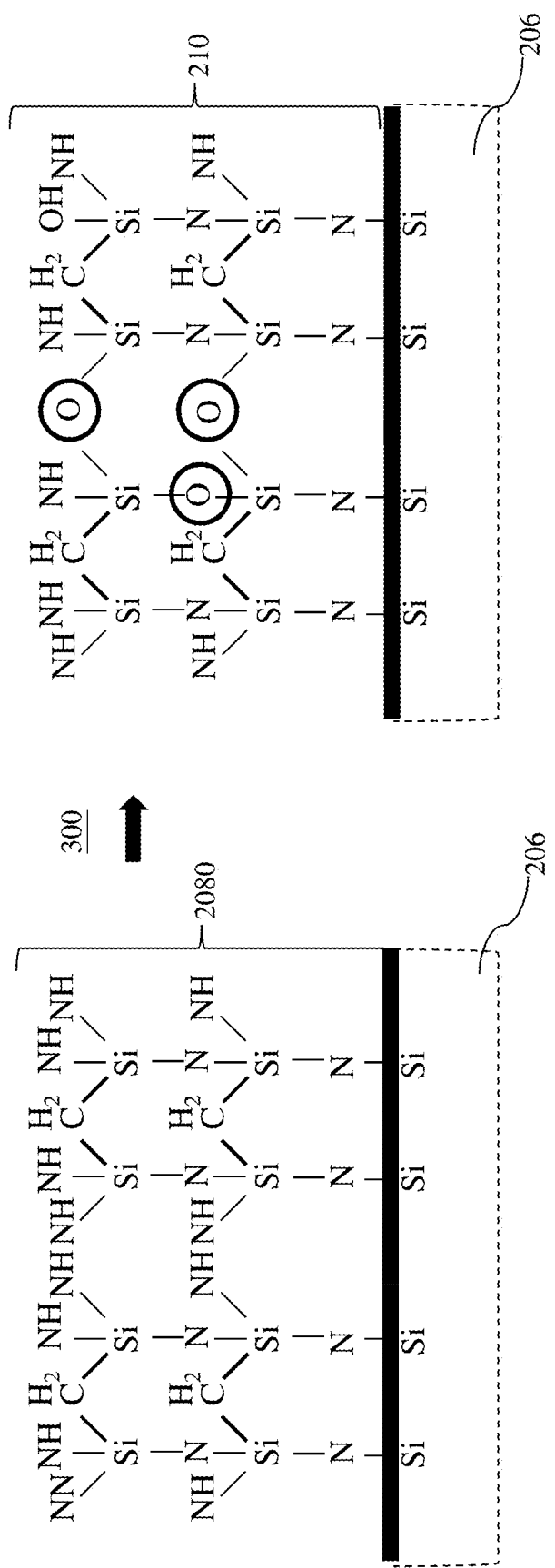
FIG. 14 illustrates schematic diagrams of an anneal process of a hybrid fin, according to various aspects of the present disclosure.

Referring to FIGS. 1 and 7, method 100 includes a block 112 where an anneal process 300 is performed to mend the hybrid fin 2080. In some embodiments, the anneal process 300 may be performed using a rapid thermal anneal (RTA) process, a laser spike anneal process, a flash anneal process, or a furnace anneal process. The anneal process 300 may include an anneal temperature between about 400° C. and about 1000° C. The anneal process 300 is performed in an oxygen-containing ambient. As used herein, the oxygen-containing ambient refers to an ambient that includes an oxygen-containing species, such as water, oxygen gas ($O_2$), or oxygen plasma. As shown in FIG. 7, macroscopically, the anneal process 300 and the oxygen-containing ambient at block 112 selectively form an outer layer 210 on exposed surfaces of the hybrid fin 2080 and a silicon oxide layer 212 on exposed surfaces of the fin structures 204. Microscopically, the anneal process 300 causes the oxygen-containing ambient to react with the hybrid fin 2080. Reference is now made to FIG. 14. The hybrid fin 2080 (or the second dielectric layer 208) may be formed with multiple ALD cycles shown in FIG. 13. For illustration purposes, the hybrid fin 2080 in FIG. 14 includes two atomic layers formed with two ALD cycles. During the anneal process 300, in an outside-in manner, some silicon-nitrogen bonds and amine functional groups are oxidized and replaced with silicon-oxygen bonds. This outside-in oxidation at block 112 transforms an exposed outer portion of the hybrid fin 2080 into an oxygen-containing outer layer 210. As shown in FIG. 7, upon conclusion of the operations at block 112, the outer layer 210 is formed on the hybrid fin 2080. The outer layer 210 does not extend to surfaces of the hybrid fin 2080 that are covered by the isolation feature 2060, which remains unchanged during the anneal process 300. In some embodiments, the outer layer 210 includes hydrogenated silicon oxycarbonitride (H:SiOCN) and the hybrid fin 2080 includes hydrogenated silicon carbonitride (H:SiCN). In these embodiments, if the hydrogen atoms are discounted, the outer layer 210 includes silicon oxycarbonitride and the hybrid fin 2080 includes silicon carbonitride. Put differently, the hybrid fin 2080 may be viewed as having an outer layer 210 and an inner feature 211 surrounded by the outer layer 210. It is observed that this selective oxidation of the hybrid fin 2080 may cause localized volume expansion and close the seam 209. As shown in FIG. 7, the outer layer 210 not only extends along top surfaces and sidewalls of the hybrid fin 2080 but also extends into the hybrid fin 2080 along its middle line. That is, the outer layer 210 may fill the seam 209, close the seam 209, render the seam 209 shallower, or otherwise render the seam 209 smaller. In embodiments where the seam 209 is still present after the formation of the outer layer 210, the seam 209 is defined in the outer layer 210 and is spaced apart from the inner feature 211 by the outer layer 210. That is, when the seam 209 is not completely filled by the outer layer 210, its surfaces are lined by the outer layer 210. Because the hybrid fin 2080 is substantially formed at block 110, the operations at block 112 mend the hybrid fin 2080 by reducing or eliminating the seam 209. In some embodiments, the outer layer 210 may account for between about 5% and about 20% of the total thickness of the hybrid fin 2080 as measured from surfaces of the hybrid fin 2080. This thickness range is critical. On the one hand, if the outer layer 210 does not reach at least 5% of the total thickness, the seam 209 may not be substantially closed. On the other hand, if the outer layer 210 account for over 20% of the total thickness, its inclusion of oxygen atoms may reduce the etch selectivity needed for etching silicon-oxide-containing features. Because the outer layer 210 is not formed on the isolation feature 2060, the outer layer 210 is selectively formed on the hybrid fin 2080 during the anneal process 300.

Figure 10:
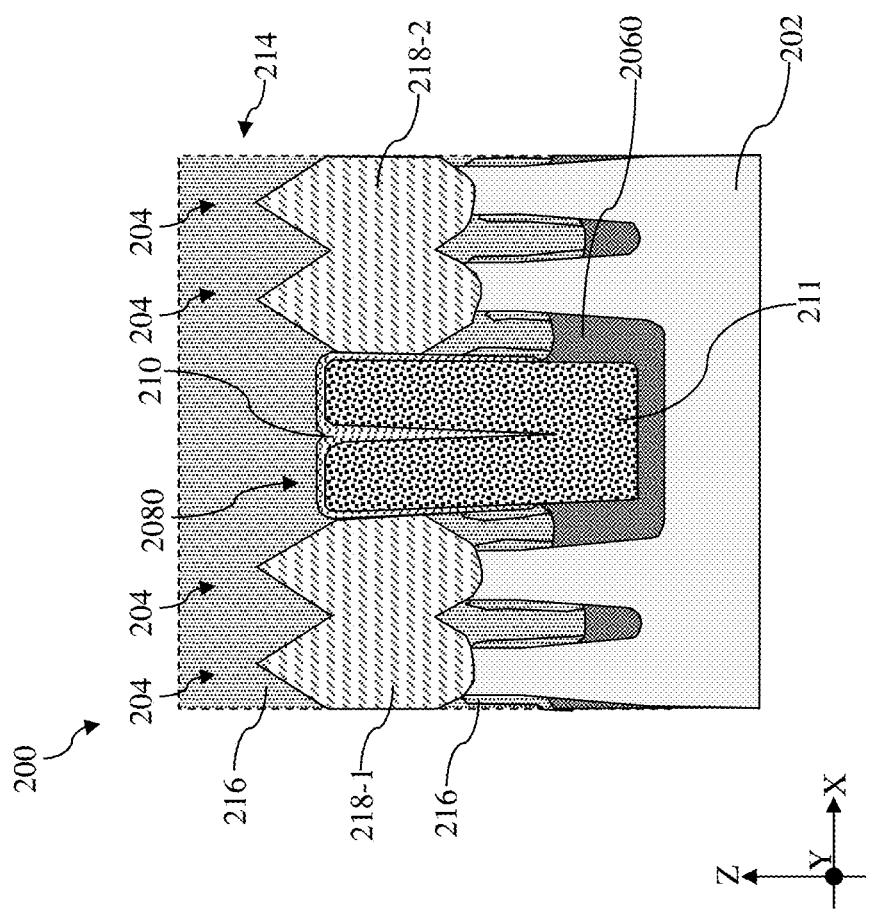
Figure 11:
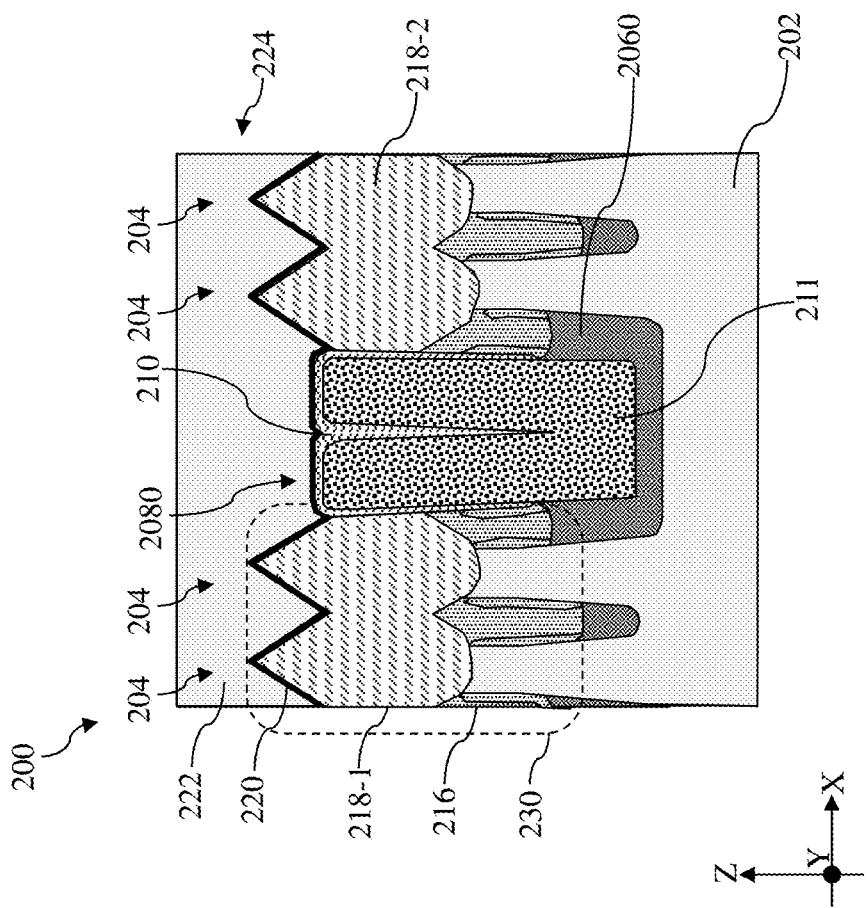
Figure 12:
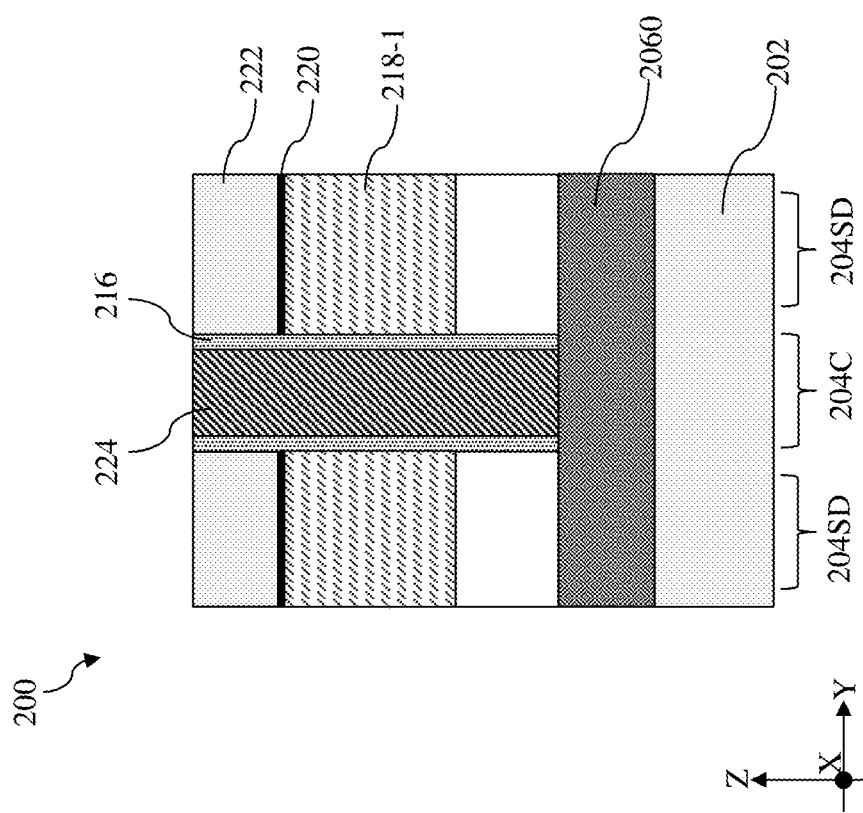

Referring to FIGS. 1, 8, 9, 10, 11, and 12, method 100 includes a block 114 where further processes are performed. Such further processes may include formation of a dummy gate stack 214 shown in FIG. 8, formation of a gate spacer 216 illustrated in FIG. 9, recessing of source/drain regions shown in FIG. 10, deposition of source/drain features 218-1 and 218-2 over the source/drain regions shown in FIG. 10, deposition of a contact etch stop layer (CESL) 220, deposition of an interlayer dielectric (ILD) layer 222 shown in FIG. 11, selective removal of the dummy gate stacks 214 shown in FIG. 11, and formation of a gate structure 224 shown in FIG. 11. FIG. 12 is a fragmentary cross-sectional view of the workpiece 200 with a viewing direction along the X direction.

Figure 8:
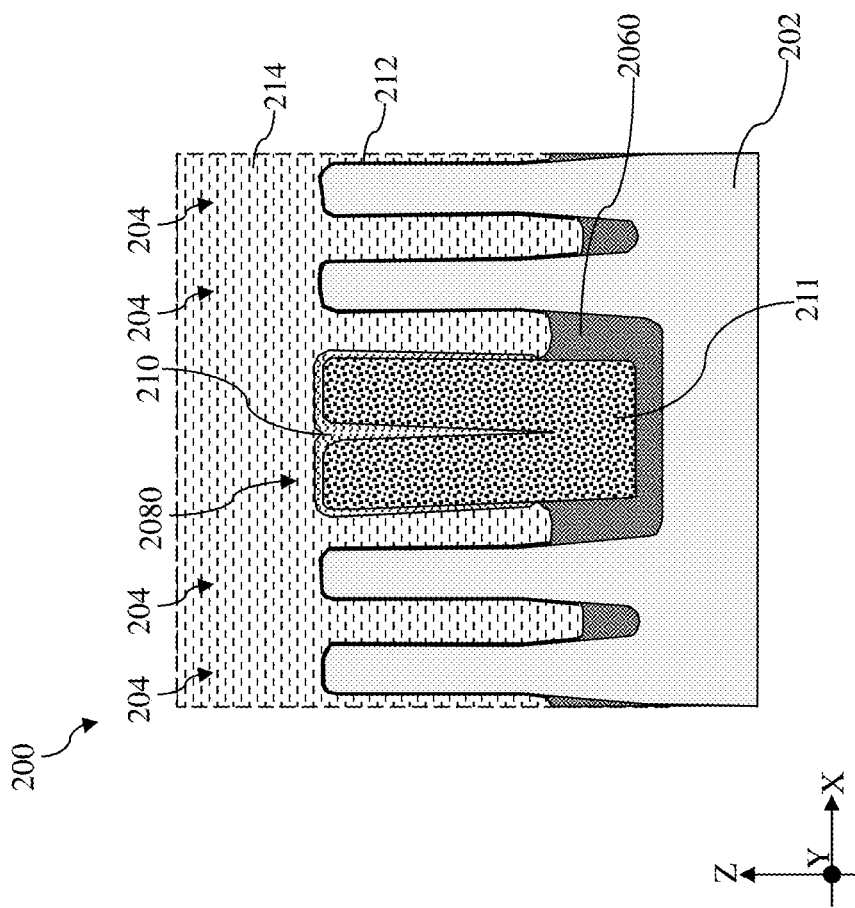

Referring to FIG. 8, a dummy gate stack 214 is formed over channel regions 204C (shown in FIG. 12) of the fin structures 204. Because the dummy gate stack 214 is not disposed over the source/drain regions 204SD (shown in FIG. 12) of the fin structures 204, the dummy gate stack 214 in FIG. 8 is out of the plane and illustrated in dotted lines. In some embodiments, a gate replacement process (or gate-last process) is adopted where the dummy gate stack 214 serves as a placeholder for a functional gate structure. Other processes and configuration are possible. In some embodiments, the dummy gate stack 214 is formed over the isolation feature 2060 and are at least partially disposed over channel regions 204C (shown in FIG. 12) of the fin structures 204. As shown in FIG. 8, the dummy gate stack 214 extends lengthwise along the X direction to wrap over the fin structures 204 that extend lengthwise along the Y direction. Portions of the fin structures 204 that are overlapped by the dummy gate stack 214 are channel regions 204C (shown in FIG. 12) and portions of the fin structures 204 that are not covered by the dummy gate stack 214 constitute the source/drain regions 204SD (shown in FIG. 12). As shown in FIG. 8, the dummy gate stack 214 is disposed over the silicon oxide layer 212, the isolation feature 2060, and the outer layer 210 of the hybrid fin 2080.

In some embodiments, the dummy gate stack 214 is formed by various process steps such as layer deposition, patterning, etching, as well as other suitable processing steps. Exemplary layer deposition processes include low-pressure CVD, CVD, plasma-enhanced CVD (PECVD), ALD, or other suitable deposition techniques, or combinations thereof. For example, the patterning process may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In an example process, a polysilicon layer for dummy gate stack 214 and a gate-top hard mask layer (not shown) are sequentially deposited over the workpiece 200, including over the fin structures 204 and the hybrid fin 2080. The deposition may be done using the aforementioned deposition processes. The deposited layers are then patterned using photolithography processes to form the dummy gate stack 214. The gate-top hard mask layer may include a silicon oxide layer and a nitride layer. The patterning of the dummy gate stack 214 may also remove the silicon oxide layer 212 that is not covered by the dummy gate stack 214.

Figure 9:
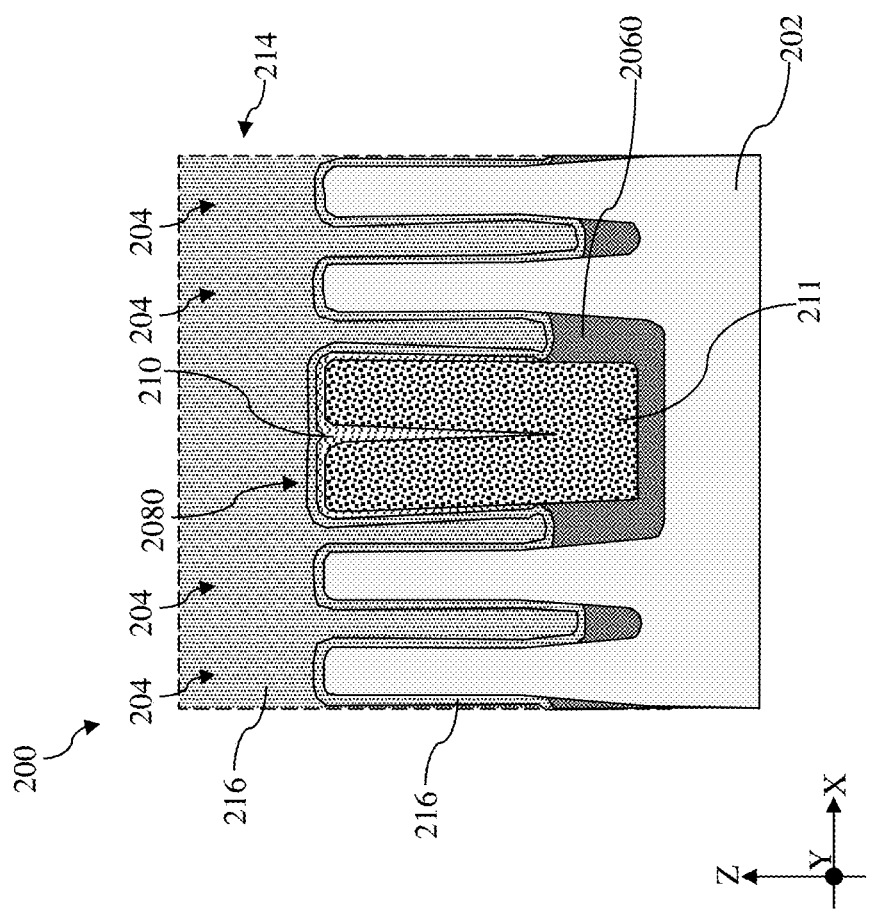

Referring to FIG. 9, a gate spacer 216 is then deposited over the workpiece 200, including over sidewalls of the dummy gate stack 214. In FIG. 9, the deposited gate spacer 216 blocks direct view of the dummy gate stack 214. Because the gate spacer 216 on sidewalls of the dummy gate stack 214 is also out of plane, it is illustrated in dotted lines in FIG. 9. In some embodiments, the formation of the gate spacer 216 includes conformal deposition of one or more dielectric layers over the workpiece 200. In an example process, the one or more dielectric layers are deposited using CVD, SACVD, ALD, or other suitable methods. The gate spacer 216 may include silicon oxide, silicon nitride, silicon carbide, silicon oxynitride, silicon carbonitride, silicon oxycarbide, silicon oxycarbonitride, and/or combinations thereof. As illustrated in FIG. 9, the gate spacer 216 extends along sidewalls of the dummy gate stack 214, surfaces of the source/drain regions 204SD (shown in FIG. 12) of the fin structures 204, and surfaces of the hybrid fin 2080. The gate spacer 216 is deposited on the outer layer 210 of the hybrid fin 2080.

Reference is now made to FIG. 10. The source/drain regions 204SD (shown in FIG. 12) of the fin structures 204 are etched back to expose the fin structures 204. In some embodiments, the etch back may include a suitable dry etch process. An example dry etch process may include hydrogen, oxygen, an a fluorine-containing gas (e.g., $CF_4$, $SF_6$, $CH_2F_2$, $CHF_3$, $C_3F_8$, $NF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. The etch back removes the gate spacer 216 on top surfaces of the source/drain regions of the fin structures 204 and exposes the fin structures 204. In some instances, the etch back may also remove a portion of the fin structures 204. After the etch back, the first source/drain feature 218-1 and the second source/drain feature 218-2 are epitaxially grown from the source/drain regions of the fin structures 204. In some embodiments, the first source/drain feature 218-1 and the second source/drain feature 218-2 may be formed using an epitaxial process, such as vapor-phase epitaxy (VPE), ultra-high vacuum CVD (UHV-CVD), molecular beam epitaxy (MBE), and/or other suitable processes. The epitaxial growth process may use gaseous and/or liquid precursors, which interact with the composition of the fin structures 204. Depending on the design of the semiconductor device 200, the first source/drain feature 218-1 and the second source/drain feature 218-2 may be either n-type source/drain features or p-type source/drain features. When the first source/drain feature 218-1 and the second source/drain feature 218-2 are n-type, they may include silicon (Si) and may be doped with an n-type dopant, such as phosphorus (P) or arsenic (As). When the first source/drain feature 218-1 and the second source/drain feature 218-2 are p-type, they may include silicon germanium (SiGe) and may be doped with a p-type dopant, such as boron (B). When the first source/drain feature 218-1 and the second source/drain feature 218-2 are doped, they may be in-situ doped during the epitaxial process or ex-situ by an implantation process (i.e., a junction implant process). In some alternative embodiments, the first source/drain feature 218-1 and the second source/drain feature 218-2 may be different types of epitaxial features. For example, the first source/drain feature 218-1 is n-type and the second source/drain feature 218-2 is p-type. In still some embodiments, each of the first source/drain feature 218-1 and the second source/drain feature 218-2 includes a first epitaxial layer and a second epitaxial layer over the first epitaxial layer. In these embodiments, a doping concentration of the second epitaxial layer may be greater than a doping concentration of the first epitaxial layer. As shown in FIG. 11, each of the first source/drain feature 218-1 and the second source/drain feature 218-2 is in direct contact with the outer layer 210 and is spaced apart from the inner feature 211 of the hybrid fin 2080.

Reference is now made to FIG. 11. After the formation of the first source/drain feature 218-1 and the second source/drain feature 218-2, a CESL 220 is deposited over the first source/drain feature 218-1 and the second source/drain feature 218-2. The CESL 220 may include silicon nitride, silicon oxynitride, and/or other materials known in the art. The CESL 220 may be deposited using ALD, PECVD and/or other suitable deposition processes. As shown in FIG. 11, the CESL 220 may be deposited on top surfaces of the first source/drain feature 218-1, the second source/drain feature 218-2, the hybrid fin 2080, and along sidewalls of the gate spacer 216 (not explicitly shown). The ILD layer 222 is then deposited over the CESL 220. In some embodiments, the ILD layer 222 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 222 may be deposited by spin-on coating, a PECVD process or other suitable deposition technique. In some embodiments, after formation of the ILD layer 222, the workpiece 200 may be annealed to improve integrity of the ILD layer 222. To remove excess materials and to expose top surfaces of the dummy gate stack 214, a planarization process, such as a CMP process, may be performed.

Referring still to FIG. 10, the exposed dummy gate stack 214 are then removed from the workpiece 200 and replaced with a gate structure 224. The removal of the dummy gate stack 214 results in a gate trench over the channel regions 204C (shown in FIG. 12) of the fin structures 204. The removal of the dummy gate stack 214 may include one or more etching processes that are selective to the material in the dummy gate stack 214. For example, the removal of the dummy gate stack 214 may be performed using as a selective wet etch, a selective dry etch, or a combination thereof. After the removal of the dummy gate stack 214, the gate structure 224 is then deposited into the gate trench to wrap over the channel regions of the fin structures. In some embodiments, the gate structure 224 includes a gate dielectric layer (not shown) and a gate electrode (not shown) formed over the gate dielectric layer. In some embodiments, the gate dielectric layer may include an interfacial layer and a high-k dielectric layer. High-K gate dielectrics, as used and described herein, include dielectric materials having a high dielectric constant, for example, greater than that of thermal silicon oxide (~3.9). The interfacial layer may include a dielectric material such as silicon oxide, hafnium silicate, or silicon oxynitride. In some embodiments, the interfacial layer may include the silicon oxide layer 212 on the channel region of the fin structures 204 if the silicon oxide layer 212 is not completely removed along with the dummy gate stack 214. The interfacial layer may be deposited using chemical oxidation, thermal oxidation, atomic layer deposition (ALD), chemical vapor deposition (CVD), and/or other suitable method. The high-K dielectric layer may include a high-K dielectric layer such as hafnium oxide. Alternatively, the high-K dielectric layer may include other high-K dielectrics, such as hafnium oxide (HfO), titanium oxide (TiO2), hafnium zirconium oxide (HfZrO), tantalum oxide (Ta2O5), hafnium silicon oxide (HfSiO4), zirconium oxide (ZrO2), zirconium silicon oxide (ZrSiO2), lanthanum oxide (La2O3), aluminum oxide (Al2O3), zirconium oxide (ZrO), yttrium oxide (Y2O3), SrTiO3 (STO), BaTiO3 (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr)TiO3 (BST), silicon nitride (SiN), silicon oxynitride (SiON), combinations thereof, or other suitable material. The high-K dielectric layer may be formed by ALD, physical vapor deposition (PVD), CVD, oxidation, and/or other suitable methods.

The gate electrode of the gate structure 224 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. In various embodiments, the gate electrode of the gate structure 224 may be formed by ALD, PVD, CVD, e-beam evaporation, or other suitable process. In various embodiments, a planarization process, such as a CMP process, may be performed to remove excessive materials to provide a substantially planar top surface of the gate structures 224. At this point, a transistor 230 is substantially formed. In the depicted embodiments, the transistor 230 is a FinFET.

While not explicitly illustrated in figures, in some alternative embodiments, method 100 may also be applicable to formation and mending of a hybrid fin in an MBC transistor. In these alternative embodiments, the fin structures 204 on the workpiece 200 may be replaced with fin-shaped structures that include a plurality of channel layers interleaved by a plurality of sacrificial layers. With the exception of the fin structures 204, operations at block 102-112 may be substantially the same. Operations at block 114 may vary when an MBC transistor is intended. For example, the recess of the source/drain region may remove the portions of the fin-shaped structures that are formed from the epitaxial stack, thereby forming source/drain recesses. Sidewalls of the channel layers and sacrificial layers are exposed in the source/drain recesses. The exposed sacrificial layers are selectively and partially etched to form inner spacer recesses. Then inner spacer features are formed in the inner spacer features. Source/drain features are epitaxially grown from sidewalls of the channel layers and the leftover fin-shaped structures in the source/drain regions. After deposition of the CESL 220 and the ILD layer 222, the workpiece 200 is planarized to expose the dummy gate stack 214. After the dummy gate stack 214 is removed, the sacrificial layers in the channel regions are selectively removed to release the channel layers as channel members. The channel members are vertically stacked one over another. The gate structure 224 is disposed over and wraps around each of the channel members.

Although not intended to be limiting, one or more embodiments of the present disclosure provide benefits. For example, processes of the present disclosure form a silicon carbonitride hybrid fin that includes amine functional groups. By use of an anneal process in the presence of an oxygen-containing ambient, the silicon carbonitride hybrid fin may be oxidized in an outside-in manner, resulting in a silicon oxycarbonitride outer layer and volume expansion of the hybrid fin. The formation of the outer layer and the volume expansion may close a seam or crevice in the hybrid fin. In other words, the anneal process may mend the hybrid fin after the hybrid fin is formed.

In one exemplary aspect, the present disclosure is directed to a semiconductor structure. The semiconductor structure includes a first source/drain feature and a second source/drain feature and a hybrid fin disposed between the first source/drain feature and the second source/drain feature and extending lengthwise along a first direction. The hybrid fin includes an inner feature and an outer layer disposed around the inner feature and the outer layer includes silicon oxycarbonitride and the inner feature includes silicon carbonitride.

In some embodiments, the hybrid fin includes a middle seam. In some implementations, the middle seam is defined in the outer layer. In some instances, the middle seam is spaced apart from the inner feature by the outer layer. In some embodiments, the first source/drain feature and the second source/drain feature are in contact with the outer layer of the hybrid fin but are spaced apart from the inner feature of the hybrid fin. In some embodiments, the semiconductor structure may further include a first fin structure and a second fin structure extending lengthwise along the first direction. The first source/drain feature is disposed over the first fin structure and the second source/drain feature is disposed over the second fin structure. In some embodiments, the semiconductor structure may further include an isolation feature disposed between the first fin structure and the second fin structure. The inner feature of the hybrid fin extends into the isolation feature and the outer layer is disposed above the isolation feature. In some instances, the hybrid fin includes a first thickness, the outer layer includes a second thickness, and the second thickness is between about 5% and about 20% of the first thickness.

In another exemplary aspect, the present disclosure is directed to a method. The method includes providing a workpiece including a substrate, a first fin structure over the substrate and a second fin structure over the substrate, conformally depositing a first dielectric layer over the workpiece, conformally depositing a second dielectric layer over the first dielectric layer, after the conformally depositing of the second dielectric layer, planarizing the workpiece to expose the first dielectric layer over the first fin structure and the second fin structure, selectively etching back the first dielectric layer until the second dielectric layer rises above the first dielectric layer, thereby forming a hybrid fin, and annealing the workpiece to selectively form an outer layer on the hybrid fin.

In some embodiments, the conformally depositing the second dielectric layer includes use of ammonia and bis (trichlorosilyl)methane. In some embodiments, the conformally depositing the second dielectric layer includes use of atomic layer deposition. In some implementations, the conformally depositing the second dielectric layer includes a process temperature between about 500° C. and about 700° C. In some instances, the first dielectric layer includes silicon oxide. In some embodiments, the annealing includes annealing at an anneal temperature between about 400° C. and about 500° C. in the presence of an oxygen-containing species. In some embodiments, the oxygen-containing species includes water or oxygen gas.

In yet another exemplary aspect, the present disclosure is directed to a method. The method includes providing a workpiece including a substrate, a first fin structure over the substrate and a second fin structure over the substrate, conformally depositing a first dielectric layer over the workpiece, conformally depositing a second dielectric layer over the first dielectric layer, after the conformally depositing of the second dielectric layer, planarizing the workpiece to expose the first dielectric layer over the first fin structure and the second fin structure, selectively etching back the first dielectric layer to form a hybrid fin that rises above the first dielectric layer, and selectively oxidizing the hybrid fin to cause a volume expansion of the hybrid fin.

In some embodiments, before the selectively oxidizing of the hybrid fin, the hybrid fin includes a seam extending along a length of the hybrid fin and after the selectively oxidizing of the hybrid fin, the seam becomes smaller. In some embodiments, the conformally depositing the second dielectric layer includes use of ammonia and bis(trichlorosilyl)methane. In some instances, the conformally depositing the second dielectric layer includes use of atomic layer deposition. In some implementations, the selectively oxidizing includes annealing the workpiece at an anneal temperature between about 400° C. and about 500° C. in the presence of an oxygen-containing species.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a first epitaxial feature and a second epitaxial feature; and a dielectric fin disposed between the first epitaxial feature and the second epitaxial feature and extending lengthwise along a first direction,
wherein the dielectric fin includes an inner feature and an outer layer disposed around the inner feature,
wherein a composition of the outer layer is different from a composition of the inner feature,
wherein the outer layer extends along a top surface and sidewalls of the inner feature,
wherein a portion of the outer layer extends into the inner feature.

2. The semiconductor structure of claim 1, wherein the outer layer comprises silicon oxycarbonitride and the inner feature comprises silicon carbonitride.

3. The semiconductor structure of claim 1, wherein the dielectric fin comprises a middle seam.

4. The semiconductor structure of claim 3, wherein the middle seam is defined in the outer layer.

5. The semiconductor structure of claim 4, further comprising:
a contact etch stop layer (CESL) dispose on the first epitaxial feature, the dielectric fin, and the second epitaxial feature,
wherein a portion of the CESL extends into the middle seam.

6. The semiconductor structure of claim 1,
wherein the first epitaxial feature is disposed over a first fin structure,
wherein the second epitaxial feature is disposed over a second fin structure,
wherein the first fin structure and the second fin structure are spaced apart from one another by an isolation feature.

7. The semiconductor structure of claim 6, wherein the dielectric fin partially extends into the isolation feature.

8. The semiconductor structure of claim 7, wherein the outer layer does not extend into the isolation feature.

9. The semiconductor structure of claim 6, further comprising:
a spacer layer disposed along sidewalls of the first fin structure, sidewalls of the second fin structure, and sidewalls of the dielectric fin.

10. The semiconductor structure of claim 9, wherein the spacer layer is in direct contact with the outer layer.

11. A method, comprising:
providing a workpiece comprising a substrate, a first group of fin structures over the substrate and a second group of fin structures over the substrate, the first group of fin structures and the second group of fin structures being spaced apart by a trench;
conformally depositing a first dielectric layer over the workpiece;
conformally depositing a second dielectric layer over the first dielectric layer;
after the conformally depositing of the second dielectric layer, planarizing the workpiece to expose the first dielectric layer over the first group of fin structures and the second group of fin structures;
selectively etching back the first dielectric layer to form a dielectric fin within the trench, the dielectric fin comprising a first portion in the first dielectric layer and a second portion rising above the first dielectric layer; and
annealing the workpiece to selectively form an outer layer on surfaces of the second portion of the dielectric fin,
wherein a composition of the first dielectric layer is different from a composition of the second dielectric layer.

12. The method of claim 11,
wherein the first dielectric layer comprises silicon oxide, silicon oxynitride, or fluorine-doped silicate glass (FSG),
wherein the second dielectric layer comprises hydrogenated silicon carbonitride (H:SiCN).

13. The method of claim 12, wherein the conformally depositing the second dielectric layer comprises use of ammonia and bis(trichlorosilyl)methane.

14. The method of claim 11, wherein the annealing comprises forming a silicon oxide layer over surfaces of the first group of fin structures and the second group of fin structures.

15. The method of claim 14, further comprising:
after the annealing, depositing a gate spacer layer over surfaces of the first dielectric layer, the first group of fin structures, the second group of fin structures, and the outer layer; and
etching back the gate spacer layer, the first group of fin structures, and the second group of fin structures.

16. The method of claim 15, wherein, after the etching back, a portion of the gate spacer layer remains disposed along sidewalls of the first group of fin structures, the second group of fin structures, and the outer layer.

17. A method, comprising:
providing a workpiece comprising:
a substrate,
a first pair of fins over the substrate,
a second pair of fins over the substrate, and
a trench disposed between the first pair of fins and the second pair of fins;
conformally depositing a first dielectric layer over the workpiece;
conformally depositing a second dielectric layer over the first dielectric layer;
after the conformally depositing of the second dielectric layer, planarizing the workpiece to expose the first dielectric layer over the first pair of fins and the second pair of fins;
selectively etching back the first dielectric layer to form a hybrid fin that rises above the first dielectric layer;
selectively oxidizing the hybrid fin to form an outer layer on the hybrid fin;
after the selectively oxidizing, depositing a gate spacer layer over surfaces of the first dielectric layer, the first pair of fins, the second pair of fins, and the outer layer; and
etching back the gate spacer layer, the first pair of fins, and the second pair of fins.

18. The method of claim 17,
wherein, before the selectively oxidizing of the hybrid fin, the hybrid fin comprises a seam extending along a length of the hybrid fin,
wherein, after the selectively oxidizing of the hybrid fin, the seam becomes smaller.

19. The method of claim 17, wherein the conformally depositing of the second dielectric layer comprises use of ammonia and bis(trichlorosilyl)methane.

20. The method of claim 17, wherein the selectively oxidizing comprises annealing the workpiece at an anneal temperature between about 400° C. and about 500° C. in the presence of an oxygen-containing species.

* * * * *